US007956691B2

(12) United States Patent
Gomez et al.

(10) Patent No.: US 7,956,691 B2
(45) Date of Patent: Jun. 7, 2011

(54) SYSTEM AND METHOD FOR OVER-VOLTAGE PROTECTION OF A POWER AMPLIFIER

(75) Inventors: Ramon Gomez, San Juan Cap, CA (US); Flavio Avanzo, Vigevano (IT); Giuseppe Cusmai, Irvine, CA (US); Takayuki Hayashi, Lake Forest, CA (US)

(73) Assignee: Broadcom Corporation, Irvine, CA (US)

( * ) Notice: Subject to any disclaimer, the term of this patent is extended or adjusted under 35 U.S.C. 154(b) by 206 days.

(21) Appl. No.: 12/481,320

(22) Filed: Jun. 9, 2009

(65) Prior Publication Data
US 2010/0264984 A1    Oct. 21, 2010

Related U.S. Application Data

(60) Provisional application No. 61/170,394, filed on Apr. 17, 2009.

(51) Int. Cl.
*H03F 3/68* (2006.01)
(52) U.S. Cl. .......................... 330/278; 330/298; 330/291
(58) Field of Classification Search .................. 330/278, 330/298, 291
See application file for complete search history.

(56) References Cited

U.S. PATENT DOCUMENTS

| | | | | |
|---|---|---|---|---|
| 4,574,287 | A * | 3/1986 | Waters | 343/756 |
| 7,701,287 | B2 * | 4/2010 | Cheng et al. | 330/251 |
| 7,800,440 | B2 * | 9/2010 | Nishimura | 330/85 |

* cited by examiner

*Primary Examiner* — Michael B Shingleton
(74) *Attorney, Agent, or Firm* — Sterne, Kessler, Goldstein & Fox, P.L.L.C.

(57) ABSTRACT

A system and method for over-voltage protection of a power amplifier is provided. A power amplifier is typically employed in a transmitter to amplify signals prior to transmission via a load; the load may include an antenna or a cable. As a result of an impedance mismatch between the power amplifier and its load, excess power from the power amplifier output fails to reach the load and must be dissipated by one or more transistors in the power amplifier. In severe impedance mismatch conditions, this dissipated power may damage or destroy the transistor(s). An automatic gain control (AGC) is provided for detecting a gain difference between the power amplifier and a replica power amplifier. A gain difference may signal an over-voltage situation. The AGC may be configured to adjust the gain of the power amplifier if a gain difference exists to prevent device damage.

20 Claims, 5 Drawing Sheets

SYSTEM AND METHOD FOR OVER-VOLTAGE PROTECTION OF A POWER AMPLIFIER

CROSS-REFERENCE TO RELATED APPLICATIONS

The present application claims the benefit of U.S. Provisional Patent Application No. 61/170,394, filed Apr. 17, 2009, which is incorporated herein by reference in its entirety.

FIELD OF THE INVENTION

This application relates generally to power amplifiers and, more specifically, to over-voltage protection of power amplifiers.

BACKGROUND

Communication devices typically communicate with one another using a transceiver that includes a transmitter section coupled to an antenna (in wireless communication devices) or a cable (in wired communication devices). The transmitter section typically includes a data modulation stage that converts raw data into baseband signals in accordance with a particular communication standard and a frequency conversion stage that mixes the baseband signals with one or more local oscillations to produce radio frequency (RF) signals. A power amplifier is employed to amplify the RF signals prior to transmission via the antenna or cable.

In both wireless and wired communication devices, a particular load impedance is expected at the output of the power amplifier. This load impedance is typically determined by the impedance of the communication device's antenna or cable and a matching network. Often, however, the load impedance varies, resulting in an impedance mismatch between the power amplifier and the load. For example, the impedance of the load may vary over the frequency range of the output signal; variation in the impedance of the load may also be introduced by the cable or antenna being disconnected during transmission.

As a result of an impedance mismatch between the power amplifier and its load, excess power from the power amplifier output fails to reach the load and must be dissipated by one or more transistors in the power amplifier. In severe impedance mismatch conditions, this dissipated power may damage or destroy the transistor(s). For example, when the cable of a wired communication device is disconnected during transmission, the output voltage of the power amplifier may become quite large, resulting in breakdown of the transistor(s). To avoid the risk of device breakdown, the output voltage of the power amplifier must be reduced in these over-voltage situations.

In conventional protection circuits, a single power detector is used to reduce the power amplifier gain when the output power exceeds a given threshold. Depending on the modulation scheme used, the absolute power detection method of the conventional approach may be too slow in responding to an over-voltage situation that occurs as a result of a change in the load impedance. For example, in modulation schemes with high crest factors (e.g., orthogonal frequency-division multiplexing and higher order quadrature amplitude modulation) a longer length of time may be necessary for the power detector to converge to an accurate power estimate. Consequently, by the time the power detector converges, the output power may have exceeded breakdown limits of devices within the power amplifier for a period of time sufficient to result in damage. Moreover, the accuracy of the conventional approach is limited, since it depends on absolute circuit parameters.

Accordingly, what is desired is a system and method that is capable of rapidly recognizing and responding to an over-voltage situation by reducing a gain of a power amplifier.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

The present invention will be described with reference to the accompanying drawings. The drawing in which an element first appears is typically indicated by the leftmost digit(s) in the corresponding reference number.

DETAILED DESCRIPTION

In the following description, numerous specific details are set forth in order to provide a thorough understanding of the invention. However, it will be apparent to those skilled in the art that the invention, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring aspects of the invention.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

Figure 1:
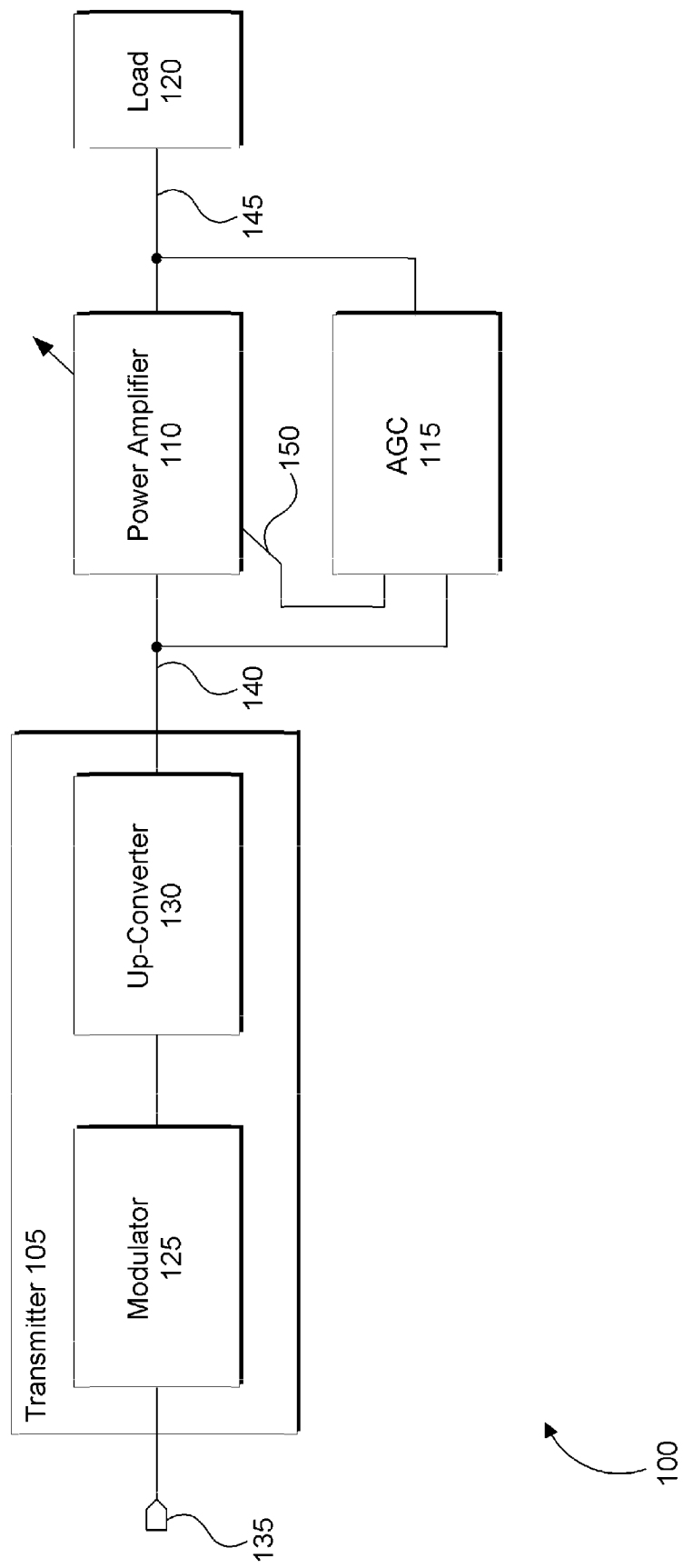
FIG. 1 illustrates an exemplary transmit path of a communication device, according to embodiments of the present invention.

FIG. 1 illustrates an exemplary transmit path 100 of a communication device in accordance with embodiments of the present invention. Transmit path 100 includes a transmitter 105, a power amplifier 110, an automatic gain control (AGC) 115, and a representative load 120.

In operation, transmitter 105 receives outbound data at an input interface 135 and processes the outbound data in accordance with a particular communication standard (e.g., IEEE802.11, Bluetooth, Ethernet, etc.) to produce a modulated signal 140 for transmission. Transmitter 105 includes a modulator 125 that converts the raw outbound data into a baseband signal and an up-converter 130 that mixes the baseband signal with one or more local oscillations to produce radio frequency (RF) signals. Although typically included in wireless communication devices, up-converter 130 may be omitted in wired communication devices that do not frequency translate the baseband signal to a higher frequency band (e.g., the RF band) prior to transmission.

Power amplifier 110 is configured to receive and amplify the relatively low level modulated signal 140 to produce amplified modulated signal 145 for transmission. Amplified modulated signal 145 is transmitted to a receiving communication device via load 120. Load 120 may comprise a cable in wired communications or an antenna in wireless communications.

The gain of power amplifier 110 may be monitored and controlled by an automatic gain control (AGC), such as AGC 115, to determine when the voltage at the output of power amplifier 110 becomes higher than the breakdown limit of transistor(s) at the output of power amplifier 110. When AGC 115 determines that an over-voltage situation exists, the gain of power amplifier 110 may be reduced via gain control signal 150 to prevent breakdown of the output transistor(s).

Over-voltage situations may occur as a result of variations in the impedance of load 120 at the output of power amplifier 110. Although not illustrated in FIG. 1, load 120 typically includes an impedance matching network coupled to either the antenna or cable. The combined impedance of the matching network and the antenna or cable may vary, for example, over the frequency range of the output signal and due to the cable or antenna being disconnected during transmission. If the impedance of the load increases (e.g., when the cable or antenna is disconnected during transmission), the output voltage of power amplifier 110 may become quite high, resulting in an over-voltage situation where the output voltage exceeds the breakdown limit of the transistor(s) at the output of power amplifier 110.

In general, as a result of an impedance mismatch between the power amplifier and its load, excess power from the power amplifier output fails to reach the load and must be dissipated by one or more transistors in the power amplifier. In severe impedance mismatch conditions, this dissipated power may damage or destroy the transistor(s).

AGC 115 may be further capable of restoring the nominal gain of power amplifier 110 after the nominal impedance of load 120 is restored, thereby allowing the ordinary functionality of transmission path 100 to return. In general, nominal values, such as the nominal gain of power amplifier 110 and the nominal impedance of load 120, are the normal or expected values used during the ordinary functionality of transmission path 100.

Figure 2:
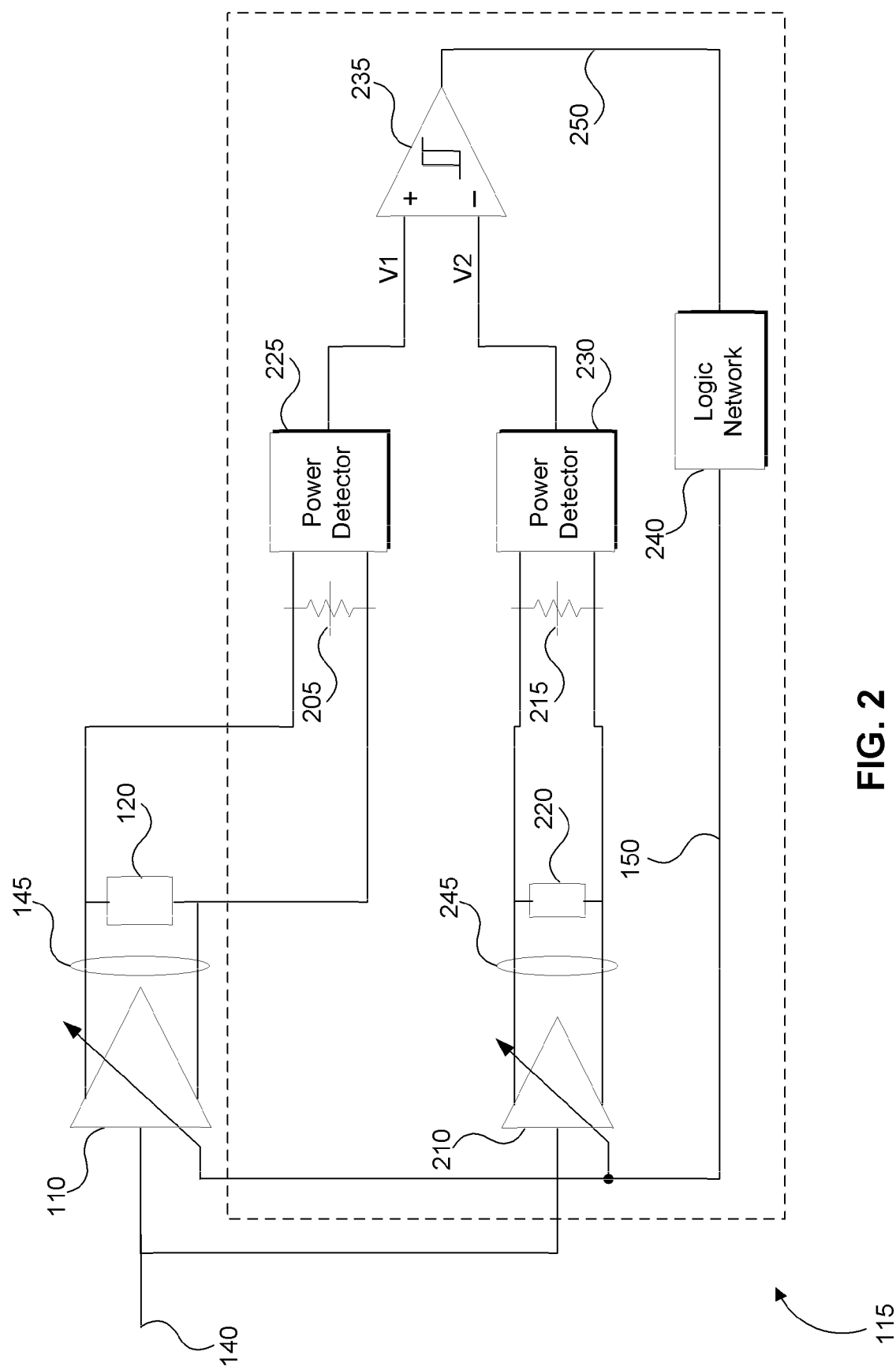
FIG. 2 illustrates an exemplary architecture for an automatic gain control as coupled to a power amplifier, according to embodiments of the present invention.

FIG. 2 illustrates an exemplary implementation for automatic gain control (AGC) 115 as coupled to power amplifier 110 in accordance with embodiments of the present invention. In the embodiment of FIG. 2, power amplifier 110 is configured as a voltage controlled current source. In effect, power amplifier 110 behaves as a transconductance device by converting an input voltage signal into an output current signal. Specifically, power amplifier 110 receives modulated signal 140 as either a single-ended or differential signal and produces amplified modulated signal 145 as either a single-ended or differential signal. As illustrated in FIG. 2, the amplified modulated signal 145, as a differential current signal, is applied to load 120 and converted back to a voltage signal.

AGC 115 is configured to reduce the gain and, therefore, the output voltage of power amplifier 110 during an over-voltage situation. As noted above, over-voltage situations may originate from an impedance mismatch between power amplifier 110 and load 120. To provide over-voltage protection, AGC 115 includes replica power amplifier 210, replica load 220, attenuators 205 and 215, power detectors 225 and 230, comparator 235, and logic network 240.

Replica power amplifier 210 is configured to provide an output voltage substantially equivalent to that produced by power amplifier 110 under nominal conditions. Specifically, replica power amplifier 210 receives modulated signal 140 and provides an output amplified modulated signal 245 that has a voltage substantially equal to the voltage of modulated signal 145 under nominal conditions. To reduce power consumption, while providing the same output voltage as power amplifier 110 under nominal conditions, replica power amplifier 210 may be configured to have a transconductance that is N times smaller than power amplifier 110 and, at the same time, the impedance of load 220 may be configured to have an impedance N times greater than load 120.

Unlike load 120, the impedance of replica load 220 may remain relatively constant during operation. Consequently, the output voltage provided by replica amplifier 210 across replica load 220 may maintain the desired or nominal output voltage expected across load 120. In general, an over-voltage situation may be determined to exist when the output voltage (or average output voltage) of power amplifier 110 exceeds the output voltage (or average output voltage) of power amplifier 210. Therefore, a comparison between the two power amplifier outputs may be used to determine the occurrence of an over-voltage situation.

Prior to comparison, the output of power amplifier 110 (i.e., amplified modulated signal 145) may be converted by power detector 225 into a DC voltage V1 proportional to its voltage amplitude or average voltage amplitude. Similarly, the output of replica power amplifier 210 (i.e., amplified modulated signal 245) may be converted by power detector 230 into a DC voltage V2 proportional to its voltage amplitude or average voltage amplitude. Power detectors 225 and 230 may be any one of a root mean square (RMS) or log type power detector, for example.

Comparator 235 may be configured to receive and compare DC output voltages V1 and V2 to provide an output comparison signal 250. DC output voltage V1 may be received by comparator 235 at a non-inverting input and DC output voltage V2 may be received by comparator at an inverting input. If the DC voltage of V1 is greater than the DC voltage of V2, comparison signal 250 may be driven to a logical high value by comparator 235 to signal an over-voltage situation. In the alternative, when the DC voltage of V1 is less than the DC voltage of V2, comparison signal 250 may be driven to a logical low value by comparator 235 to signal nominal conditions exist.

Coupled between power amplifiers 110 and 210 and power detectors 225 and 230 may be attenuators 205 and 215, respectively. Attenuators 205 and 215 may be configured to reduce the voltage swing at the inputs of power detectors 225 and 230.

Logic network 250 may be configured to receive comparison signal 250 and provide gain control signal 150 as output. Based on the value of comparison signal 240, logic network 250 may be configured to reduce or increase the gain of power amplifier 110. Specifically, if comparison signal 250 is a logical high value, signaling an over-voltage situation, logic network 240 may be configured to reduce the gain of power amplifier 110. If comparison signal 250 is a logical low value, signaling nominal conditions, logic network 240 may be configured to maintain or restore the nominal gain of power amplifier 110.

In an embodiment, logic network 240 is configured to reduce the gain of power amplifier 110 by an amount necessary to prevent breakdown of transistor(s) at the output of power amplifier 110 during the worst case over-voltage situation. During the worst case over-voltage situation the output voltage of power amplifier 110 may have an output voltage that is substantially twice the nominal output voltage value.

Logic network 240 may be further configured to reduce and increase the gain of replica amplifier 210 via gain control signal 150. In general, the gain of replica power amplifier 210 is adjusted by logic network 240 to follow the gain of power amplifier 110. By adjusting the gain of replica power amplifier 210 to follow the gain of power amplifier 110, the logical relationship between the outputs of power detectors 225 and 230 is maintained. That is, when V1 is greater than V2 an over-voltage situation exists and, in the alternative, when V2 is greater than V1 nominal conditions exist. Maintaining this relationship between V1 and V2 allows AGC 115 to restore the gain of power amplifier 110 when nominal conditions return after an over-voltage situation and react to subsequent over-voltage situations.

Given that signals V1 and V2 may be subject to noise, the output of comparator 235 may make many undesirable transitions if the output of comparator 235 transitions precisely when either V1 or V2 becomes greater than the other. To prevent any undesired transitioning, hysteresis may be further added to AGC 115. In general, hysteresis may provide for an effective switching threshold for comparator 235 that is different for an increasing differential input than for a decreasing differential input. The input differential voltages at which the output of comparator 235 transitions may be referred to as hysteresis threshold voltages. Specifically two hysteresis threshold voltages, $V_{th1}$ and $V_{th2}$ may be implemented such that the output of comparator 235 transitions under the following two conditions:

$$V1 > V2 + V_{th1}; \text{ and}$$

$$V1 < V2 - V_{th2}.$$

As long as the peak-to-peak noise is less than the width of the hysteresis zone provided by threshold voltages $V_{th1}$ and $V_{th2}$, noise added to the input signals V1 and V2 may not cause undesired transitions at the output of comparator 235. In general, the values of $V_{th1}$ and $V_{th2}$ may be selected to provide a hysteresis zone with a width sufficient to prevent undesired transitions in the output of comparator 235, while not affecting the ability of AGC 115 to rapidly respond to over-voltage situations. In an embodiment, hysteresis threshold voltage $V_{th1}$ and $V_{th2}$ are set equal.

Hysteresis may be further added to AGC 115 to provide for rapid or abrupt changes in the output of comparator 235. That is, the logic level of comparison signal 250 may rapidly change from a logical high value to a logical low value and vice-versa using hysteresis, thereby allowing for rapid reaction to an over-voltage situation.

Hysteresis may be implemented by adding positive feedback from the output of comparator 235 to the non-inverting input of comparator 235. The positive feedback may be provided with any one of a resistive network, capacitive network, inductive network, or any combination thereof. Alternatively, hysteresis may be further implemented by making the nominal gain of replica power amplifier 210 greater than the nominal gain of power amplifier 110.

Conventional AGCs typically implement a single power detector to compare the output power of a power amplifier, such as power amplifier 110, to a given threshold. If the output power of the power amplifier exceeds the given threshold, the conventional AGC reduces the power amplifier gain. In contrast to this conventional approach, AGC 115 is configured, in general, to detect the gain difference between power amplifier 110 and replica power amplifier 210. Detecting the gain difference is equivalent to detecting a change in the impedance of load 120 and, as a result, a potential over-voltage situation.

The conventional AGC depends on absolute power detection of the amplified signal provided by the power amplifier, whereas AGC 115 may only depend on the matching between power amplifier 110 and replica power amplifier 210. Depending on the modulation scheme used, the absolute power detection method of the conventional AGC may be too slow in responding to an over-voltage situation that occurs as a result of a change in load impedance 120. For example, in modulation schemes with high crest factors (e.g., orthogonal frequency-division multiplexing and higher order quadrature amplitude modulation) a longer length of time may be necessary for the power detector to converge to an accurate power estimate. Consequently, by the time the power detector converges, the output power may have exceeded breakdown limits of devices within the power amplifier for a period of time sufficient to result in damage.

Figure 3:
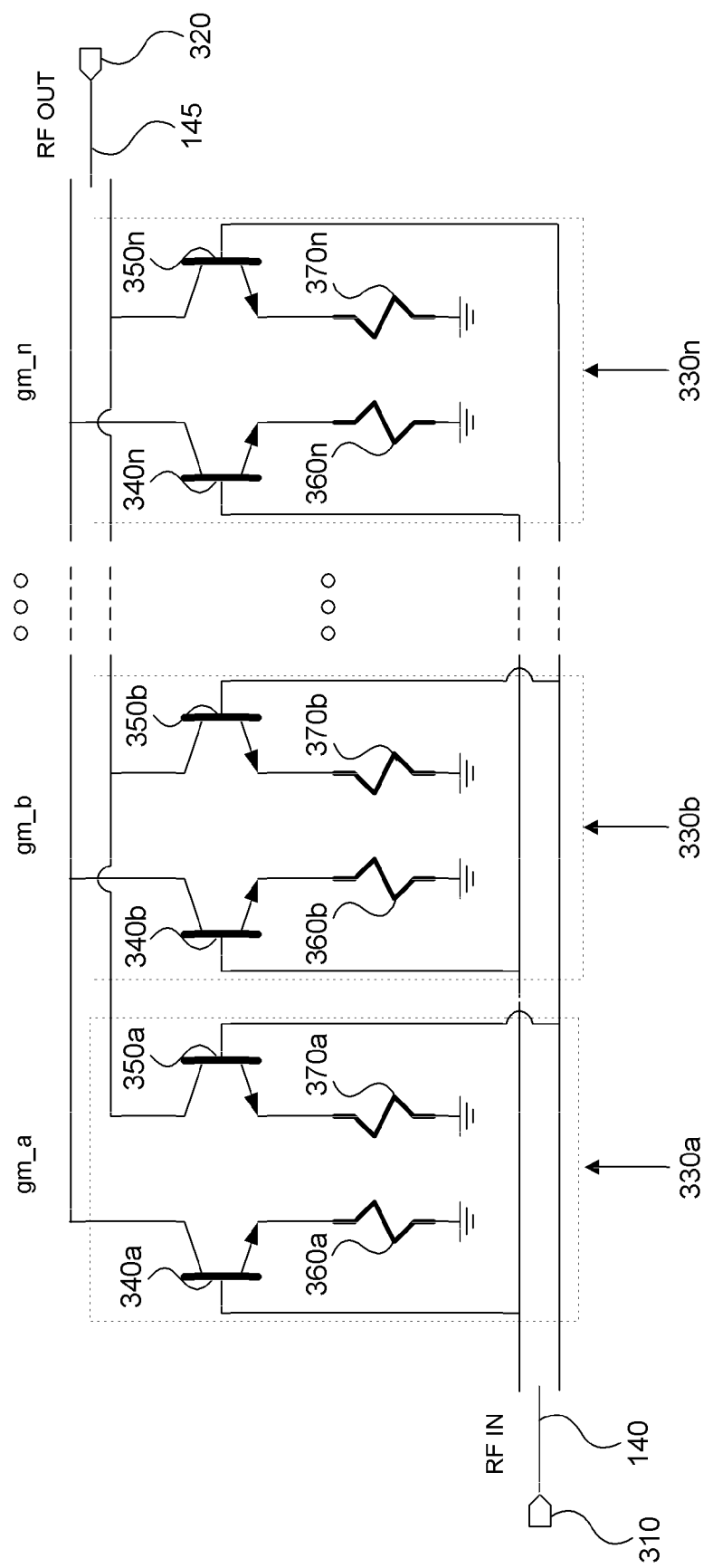
FIG. 3 illustrates a simplified implementation of an exemplary power amplifier, according to embodiments of the present invention.

FIG. 3 illustrates a simplified implementation of an exemplary power amplifier 110, according to embodiments of the present invention. Exemplary power amplifier 110 is not limiting of the scope of embodiments of the present invention.

As shown in FIG. 3, exemplary power amplifier 110 employs a differential implementation and includes a differential input at terminal 310 for receiving modulated signal 140 and a differential output at terminal 320 for providing amplified modulated signal 145. In other embodiments, exemplary power amplifier 110 may use a single-ended implementation.

Exemplary power amplifier 110 further includes a plurality of parallel collector-coupled differential amplification stages 330*a-n*. Although not shown, the common collector nodes of the plurality of amplification stages 310*a-n* may be connected to a voltage source $V_{CC}$ through pull-up resistors. Each differential amplification stage 310*a-n* includes two bipolar junction transistors (BJTs) 340*a-n* and 350*a-n*. The emitters of the BJTs are coupled to ground or a negative supply through variable resistive elements 360*a-n* and 370*a-n*. In an embodiment, variable resistive elements 360*a-n* and 370*a-n* may be implemented as current sources using one or more transistors, such as BJTs.

The gain of exemplary power amplifier 110 is programmable and may be controlled via gain control signal 150 (not shown). Specifically, gain control signal 150 may be configured to control variable resistive elements 360*a-n* and 370*a-n*. To reduce the gain of exemplary power amplifier 110, the resistance of variable resistive elements 360*a-n* and 370*a-n* may be increased. To increase the gain of exemplary power amplifier 110, the resistance of variable resistive elements 360*a-n* and 370*a-n* may be decreased. In an alternative embodiment, the gain of exemplary power amplifier 110 may be controlled by turning on/off select ones of differential amplification stages 330*a-n*.

As noted above, exemplary power amplifier 110 is provided for the purpose of illustration and not limitation. Other equivalent implementations and/or variations of exemplary power amplifier 110 are possible as would be understood by a person skilled in the art based on the teachings herein. Equivalent implementations and/or variations may include, for example, variations in transistor type (e.g., PNP, MOSFET, JFET, CMOS, etc.), variations in amplifier configuration (e.g., common-collector, common-base, common-source, common-drain, common-gate, Darlington pair, Cascode, Sziklai pair, etc.), and variations in amplifier input/output configuration (e.g., single-ended, single-input-single-output, single-input-multiple-output, etc.).

Figure 4:
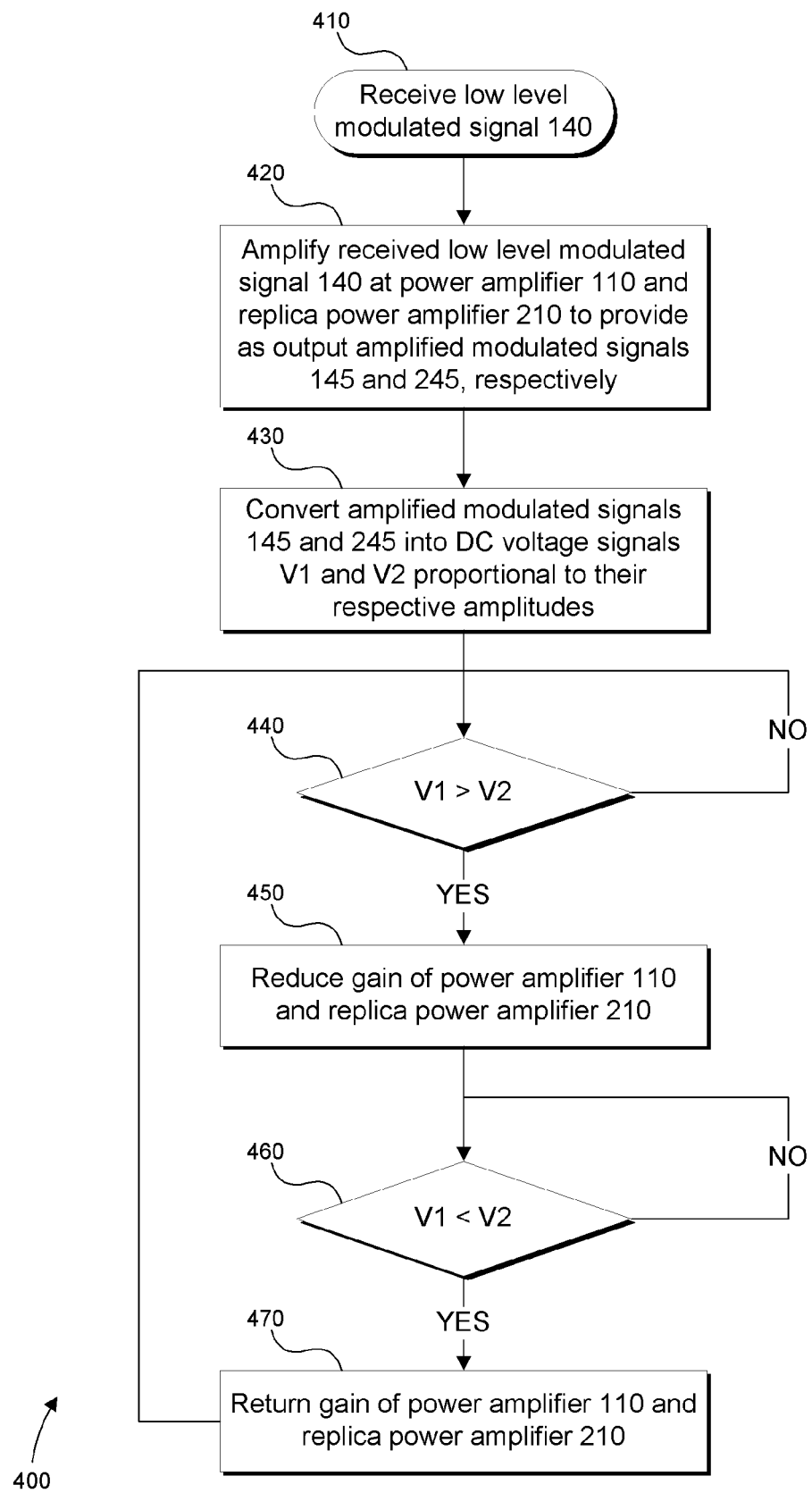
FIG. 4 illustrates an exemplary flowchart 400 of a method for over-voltage protection of a power amplifier, according to embodiments of the present invention.

FIG. 4 illustrates an exemplary flowchart 400 of a method for over-voltage protection of a power amplifier in accordance with embodiments of the present invention. Flowchart 400 will be described with continued reference to exemplary AGC 115 described in reference to FIGS. 1 and 2, above. However, the invention is not limited to those embodiments.

The method of flowchart 400 begins at step 410, in which power amplifier 110 and replica power amplifier 210 receive low-level modulated signal 140. After receiving low-level modulated signal 140, flowchart 400 proceeds to step 420.

At step 420, power amplifier 110 and replica power amplifier 210 amplify the received signal and provide as output amplified modulated signals 145 and 245, respectively. After amplification, flowchart 400 proceeds to step 430.

At step 430, the amplified modulated signals provided by power amplifier 110 and replica amplifier 210 are applied across their loads and converted to DC voltage signals V1 and V2 proportional to their voltage amplitudes or average voltage amplitudes by power detectors 225 and 230. After conversion of modulated signals 145 and 245, flowchart 400 proceeds to step 440. It should be noted that, although shown as the first three steps within flowchart 400, steps 410, 420, and 430 are executed continuously during transmission and DC voltage signals V1 and V2 are updated accordingly.

At step 420 a determination is made as to whether DC voltage signal V1 is greater than DC voltage signal V2. The determination may be performed by comparator 235 as described above. If V1 is less than V2, flowchart 400 remains at step 440, waiting for the potential occurrence of V1 becoming greater than V2. If V1 is or becomes greater than V2, an over-voltage situation exists, and flowchart 400 proceeds to step 450.

At step 450 the gain of power amplifier 110 and replica power amplifier 210 is reduced by logic network 240, which, in turn, reduces the voltage at the output of power amplifier 110. After step 450, flowchart 400 proceeds to step 460.

At step 460 a determination is made as to whether DC voltage signal V1 is less than DC voltage signal V2. The determination may be performed by comparator 235 as described above. If V1 is greater than V2, flowchart 400 remains at step 460, waiting for nominal conditions to return. If V1 is or becomes less than V2, nominal conditions exist, and flowchart 400 proceeds to step 470.

At step 470 the gain of power amplifier 110 and replica power amplifier 210 is returned to their respective nominal gain values by logic network 240. After step 470, flowchart 400 proceeds to step 440, waiting for the next potential occurrence of V1 becoming greater than V2 (i.e., an over-voltage situation).

Figure 5:
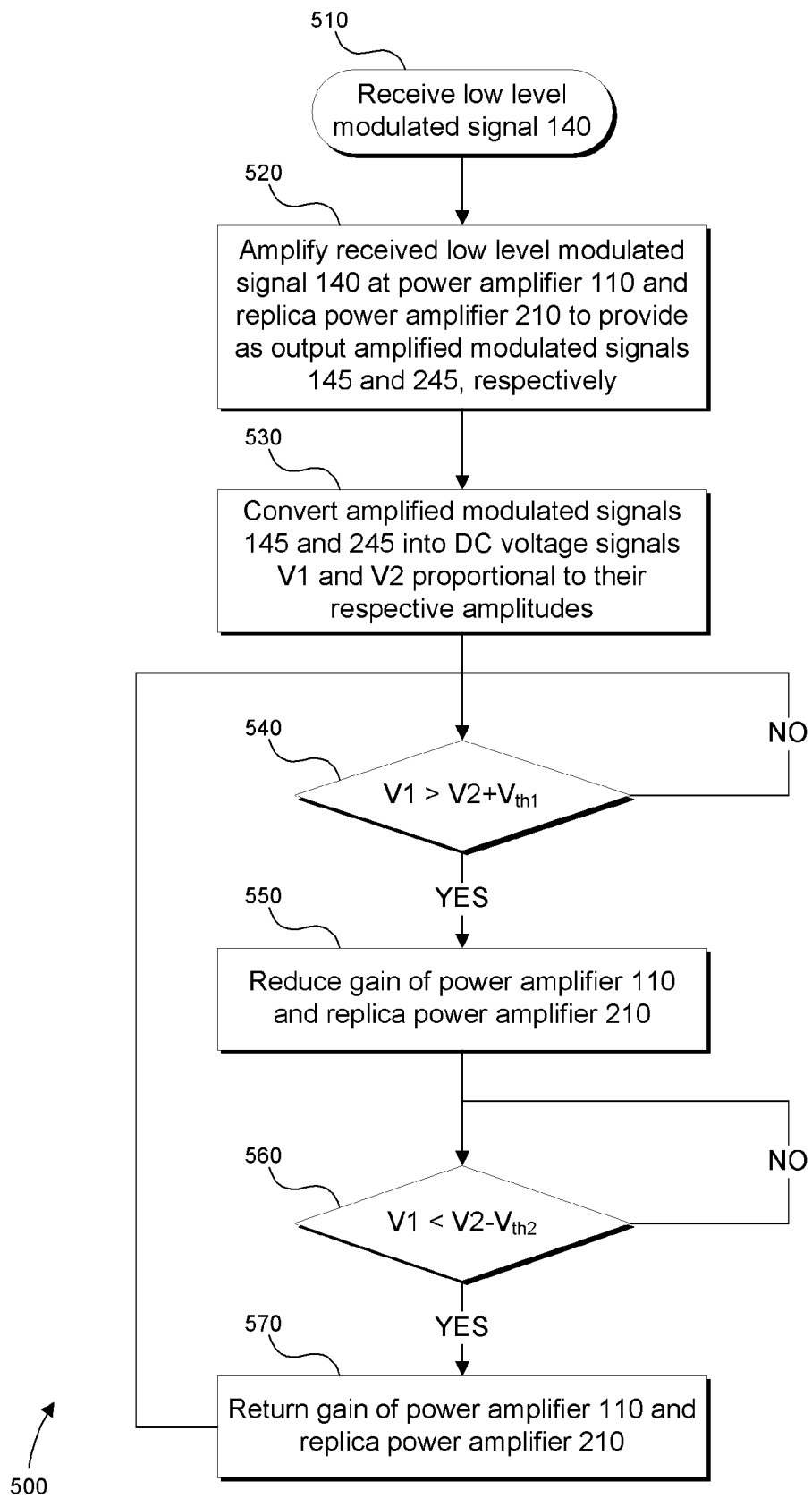
FIG. 5 illustrates an exemplary flowchart 500 of a method for over-voltage protection of a power amplifier that further utilizes hysteresis, according to embodiments of the present invention.

FIG. 5 illustrates an exemplary flowchart 500 of a method for over-voltage protection of a power amplifier that further utilizes hysteresis in accordance with embodiments of the present invention. Flowchart 500 will be described with continued reference to exemplary AGC 115 described in reference to FIGS. 1 and 2, above. However, the invention is not limited to those embodiments.

The method of flowchart 500 begins at step 510, in which power amplifier 110 and replica power amplifier 210 receive low-level modulated signal 140. After receiving low-level modulated signal 140, flowchart 500 proceeds to step 520.

At step 520, power amplifier 110 and replica power amplifier 210 amplify the received signal and provide as output amplified modulated signals 145 and 245, respectively. After amplification, flowchart 500 proceeds to step 530.

At step 530, the amplified modulated signals provided by power amplifier 110 and replica amplifier 210 are applied across their loads and converted to DC voltage signals V1 and V2 proportional to their voltage amplitudes or their average voltage amplitudes by power detectors 225 and 230. After conversion of modulated signals 145 and 245, flowchart 500 proceeds to step 540. It should be noted that, although shown as the first three steps within flowchart 500, steps 510, 520, and 530 are executed continuously during transmission and DC voltage signals V1 and V2 are updated accordingly.

At step 540 a determination is made as to whether DC voltage signal V1 is greater than the sum of DC voltage signal V2 and hysteresis threshold voltage $V_{th1}$. The determination may be performed by comparator 235 as described above. If V1 is less than the sum of V2 and $V_{th1}$, flowchart 500 remains at step 540, waiting for the potential occurrence of V1 becoming greater than the sum of V2 and $V_{th1}$. If V1 is or becomes greater than the sum of V2 and $V_{th1}$, an over-voltage situation exists, and flowchart 500 proceeds to step 550.

At step 550 the gain of power amplifier 110 and replica power amplifier 210 is reduced by logic network 240, which, in turn, reduces the voltage at the output of power amplifier 110. After step 550, flowchart 500 proceeds to step 560.

At step 560 a determination is made as to whether DC voltage signal V1 is less than the difference between DC voltage signal V2 and hysteresis threshold voltage $V_{th2}$. The determination may be performed by comparator 235 as described above. If V1 is greater than the difference between V2 and $V_{th2}$, flowchart 500 remains at step 560, waiting for nominal conditions to return. If V1 is or becomes less than the difference between V2 and $V_{th2}$, nominal conditions exist, and flowchart 500 proceeds to step 570.

At step 570 the gain of power amplifier 110 and replica power amplifier 210 is returned to their respective nominal gain values by logic network 240. After step 570, flowchart 500 proceeds to step 540, waiting for the next potential occurrence of V1 becoming greater than the sum of V2 and $V_{th1}$ (i.e., an over-voltage situation).

CONCLUSION

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. A system for over-voltage protection, comprising:
   a first power amplifier configured to receive a modulated signal and to provide a first amplified modulated signal across a first load;
   a second power amplifier configured to receive the modulated signal and to provide a second amplified modulated signal across a second load;
   a first power detector configured to provide a first power signal proportional to an average voltage of the first amplified modulated signal;
   a second power detector configured to provide a second power signal proportional to an average voltage of the second amplified modulated signal;
   a comparator configured to generate a comparison signal based on a comparison between the first power signal and the second power signal; and
   a logic network configured to adjust a gain of the first power amplifier and a gain of the second power amplifier based on the comparison signal.

2. The system of claim 1, wherein a voltage of the second amplified modulated signal is substantially equal to the voltage of the first amplified modulated signal under nominal conditions.

3. The system of claim 2, wherein nominal conditions exist when the impendance of the first load is substantially equal to an expected impedance.

4. The system of claim 1, wherein the first power amplifier and the second power amplifier are configured as transconductance devices.

5. The system of claim 4, wherein the transconductance of the second power amplifier is substantially N times smaller than the transconductance of the first power amplifier.

6. The system of claim 5, wherein the second load has an impedance that is substantially N times larger than the impedance of the first load.

7. The system of claim 5, wherein the second load has a resistance that is substantially N times larger than the resistance of the first load.

8. The system of claim 1, wherein:
   the logic network is configured to reduce the gain of the first power amplifier and the second power amplifier if the first power signal becomes greater than the sum of the second power signal and a first threshold value; and
   the logic network is configured to increase the gain of the first power amplifier and the second power amplifier if the first power signal becomes less than the difference between the second power signal and a second threshold value.

9. The system of claim 1, wherein the comparator has hysteresis.

10. The system of claim 1, wherein the first load comprises at least one of an antenna or a cable.

11. A method for over-voltage protection, comprising:
    providing a modulated signal to a first power amplifier to produce a first amplified modulated signal;
    providing the modulated signal to a second power amplifier to produce a second amplified modulated signal;
    detecting a gain difference between the first power amplifier and the second power amplifier; and
    adjusting a gain of the first power amplifier and a gain of the second power amplifier based on the gain difference.

12. The method of claim 11, further comprising:
    converting the first amplified modulated signal into a first power signal proportional to an average voltage of the first amplified modulated signal;
    converting the second amplified modulated signal into a second power signal proportional to an average voltage of the second amplified modulated signal.

13. The method of claim 12, further comprising:
    comparing the first power signal and the second power signal to generate a comparison signal.

14. The method of claim 13, wherein the gain difference between the first power amplifier and the second power amplifier is detected based on the comparison signal.

15. The method of claim 14, wherein adjusting a gain of the first power amplifier and a gain of the second power amplifier based on the gain difference comprises:
    reducing the gain of the first power amplifier and the gain of the second power amplifier if the first power signal becomes greater than the sum of the second power signal and a first threshold value; and
    increasing the gain of the first power amplifier and the gain of the second power amplifier if the first power signal becomes less than the difference between the second power signal and a second threshold value.

16. A transmission path that includes a system for over-voltage protection, the transmission path comprising:
    a transmitter configured to provide a modulated signal;
    a first power amplifier configured to amplify the modulated signal; and
    an automatic gain control (AGC) comprising a second power amplifier configured to amplify the modulated signal;
    wherein the AGC is configured to detect a gain difference between the first power amplifier and the second power amplifier and to adjust the gain of the first power amplifier and the gain of the second power amplifier based on the gain difference.

17. The transmission path of claim 16, wherein the AGC further comprises:
    a first power detector configured to provide a first power signal proportional to an average voltage of the first amplified modulated signal; and
    a second power detector configured to provide a second power signal proportional to an average voltage of the second amplified modulated signal.

18. The transmission path of claim 17, wherein the AGC further comprises:
    a comparator configured to generate a comparison signal based on a comparison between the first power signal and the second power signal.

19. The transmission path of claim 18, wherein the gain difference between the first power amplifier and the second power amplifier is detected based on the comparison signal.

20. The transmission path of claim 17, wherein:

the AGC is configured to reduce the gain of the first power amplifier and the second power amplifier if the first power signal becomes greater than the sum of the second power signal and a first threshold value; and the AGC is configured to increase the gain of the first power amplifier and the second power amplifier if the first power signal becomes less than the difference between the second power signal and a second threshold value.

* * * * *